United States Patent [19]

Iafrate et al.

[11] 4,427,913
[45] Jan. 24, 1984

[54] ACOUSTIC DIFFRACTOMETER

[75] Inventors: Gerald J. Iafrate, Toms River; Arthur Ballato, Long Branch, both of N.J.

[73] Assignee: The United States of America as represented by the Secretary of the Army, Washington, D.C.

[21] Appl. No.: 480,624

[22] Filed: Mar. 30, 1983

Related U.S. Application Data

[63] Continuation of Ser. No. 269,283, Jun. 1, 1981, abandoned.

[51] Int. Cl.³ .................................................. H01L 41/08
[52] U.S. Cl. ...................................... 310/334; 310/311; 310/313 B; 310/322; 333/150; 333/187
[58] Field of Search .................... 310/311, 334, 313 B, 310/322; 333/150, 152, 187–193

[56] References Cited

U.S. PATENT DOCUMENTS

| | | | |
|---|---|---|---|
| 3,414,779 | 12/1968 | Bohm .............................. | 310/334 X |
| 3,422,371 | 1/1969 | Poirier et al. .................. | 310/322 X |
| 3,543,058 | 11/1970 | Klemens ........................ | 310/334 |
| 3,568,108 | 3/1971 | Poirier et al. .................. | 310/311 |
| 4,166,967 | 9/1979 | Benes et al. ................... | 310/334 X |

*Primary Examiner*—Mark O. Budd
*Attorney, Agent, or Firm*—Robert P. Gibson; Jeremiah G. Murray; Michael C. Sachs

[57] ABSTRACT

The use of fabricated periodic piezoelectric structures fabricated from high resistivity semiconducting crystals in detecting millimeter waves in the GHz range is disclosed.

6 Claims, 5 Drawing Figures

ACOUSTIC DIFFRACTOMETER

The invention described herein may be manufactured, used, and licensed by or for the Government for governmental purposes without the payment to me of any royalties thereon or therefor.

This application is a continuation of application Ser. No. 269,,283, filed June 1, 1981 now abandoned.

BACKGROUND AND FIELD OF THE INVENTION

Broadly speaking, this invention relates to periodic piezoelectric structures. More particularly, in a preferred embodiment, this invention relates to periodic, piezoelectric structures which are fabricated from high resistivity, semiconducting crystals, such as those in cubic class 43 m.

The frequency range of 100 to 300 GHz is of great interest to both military and civil authorities. Among the possible uses for this frequency band are fixed and mobile radar systems, terrestrial and satellite communications systems, etc. Unfortunately, heretofore, no satisfactory detector or monochrometer has been available for use of these high frequencies, which factor has greatly retarded the development of millimeter wave systems of this type.

While the piezoelectric properties of high-resistivity semi-conductor material, such as GaAs, have been widely reported in the literature, we have discovered that these properties may be used to fabricate a periodic, piezoelectric structure that can be used to detect and transmit millimeter waves in the aforesaid 100–300 GHz range. Indeed, it is anticipated that the instant invention will generate an entirely new class of piezoelectric devices including detectors, filters, monochrometers, and signal processing devices.

It is pointed out that periodic structures have been fabricated which make use of variation in electrical properties from layer to layer.

In the present invention, however, the alternating layers are not electrically active, no donors or acceptors of electrons present, but are piezoelectrically active, highly insulating dielectrics with permanent electric dipoles being coupled to mechanical stress fields with acoustic mismatch, or piezoelectrically inactive insulators with acoustic mismatch.

SUMMARY OF THE INVENTION

In a preferred embodiment, the invention comprises an acoustic diffractometer in which acoustic waves (phonons) are diffracted through a piezoelectric superlattice, analogous to a diffraction grating, over an arbitrarily wide frequency range, including the desired 100–300 GHz range. Advantageously, the piezoelectric superlattice is formed from a high-resistivity, semi-conducting crystalline material, for example, materials in the cubic class $\overline{43}$ m. This class includes most of the II–VI and III–V compounds, such as GaAs and GaAlAs.

The foregoing and other objects and advantages of the invention will appear from the following description. In the description reference is made to the accompanying drawings which form a part hereof, and in which there is shown by way of illustration and not of limitation a preferred embodiment. Such description does not represent the full scope of the invention, but rather the invention may be employed in different arrangements as will be appreciated by those skilled in the art.

DETAILED DESCRIPTION OF THE INVENTION

As previously discussed, in a preferred embodiment the instant invention comprises an acoustic diffraction grating in the form of a piezoelectric superlattice. The acoustic waves are diffracted through the grating with a wavelength of propagation that is commensurate with the corresponding wavelength of the superlattice.

The advent of molecular beam epitaxy (MBE) has made possible the fabrication of such superlattice structures especially for the piezoelectric compounds in question.

Figure 1:
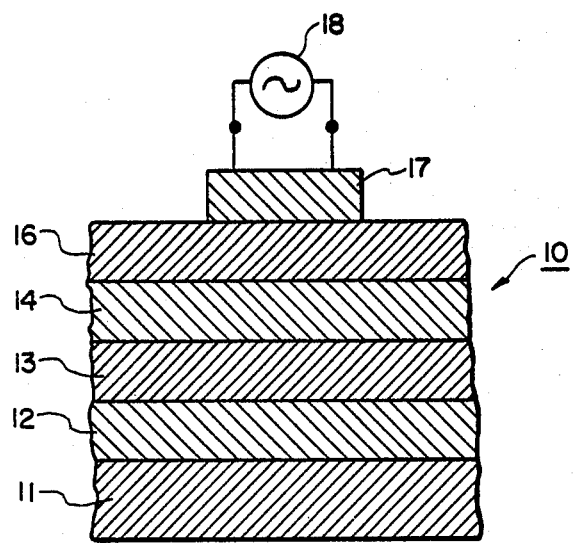
FIG. 1 is a cross-sectional view of a one-port, longitudinal embodiment of the invention.

FIG. 1 depicts a first illustrative embodiment of the invention. As shown, acoustic diffraction grating 10 comprises a plurality of alternating layers of piezoelectric material and results in the previously referred to piezoelectric superlattice. Specifically, acoustic grating 10 comprises a substrate 11, e.g., of bulk gallium arsenide, supporting an epitaxially grown layer of GaAs 12, an epitaxially grown layer of GaAlAs 13, a second epitaxially grown layer of GaAs 14, a second epitaxially grown layer of GaAlAs 16 and so on. Some suitable resonant or non-resonant acoustic transducer 17 is mounted to the top of grating 10 to energize the same with means, 18, for generating a signal to power transducer 17. Upon launching an acoustic wave through the diffraction grating, the wavelengths of propagation will be dictated by the lattice spacing of the piezoelectric superlattice. This is the essence of an acoustic diffractometer. Such a device can be made to exhibit sharp frequency resonances, similar to a traditional quartz bulk-wave crystal, but the frequencies involved will be much higher than can be realized in the quartz case because of the extremely thin epitaxial ayers of alternating materials. For example, typical layer thicknesses are of the order 100 Å, or one-hundredth of a micrometer. This leads to acoustic resonances in the frequency range of 100 to 300 GHz. This range corresponds to millimeter electromagnetic wavelengths. The output of FIG. 1 and input are at the same location, element 17, here. While the layers are only hundreds of Angstroms thick the lateral dimensions are much larger, typically about one millimeter.

Figure 2:
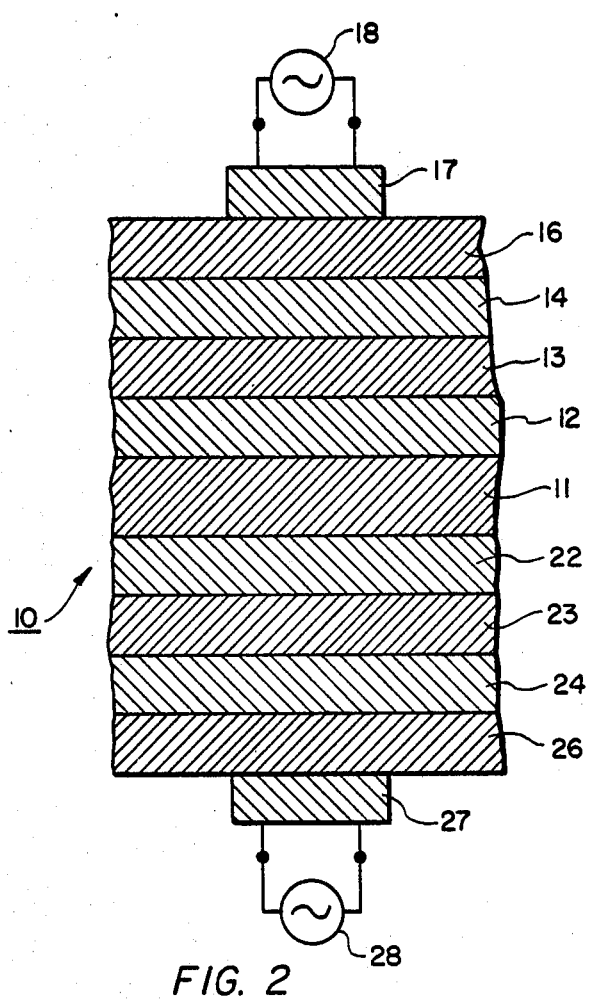
FIG. 2 is a cross-sectional view of a two-port, longitudinal embodiment of the invention.

FIG. 2 depicts a second illustrative embodiment of the instant invention. As shown, acoustic diffraction grating 10 comprises a plurality of alternating layers of piezoelectric material and results in the previously mentioned piezoelectric superlattice. Specifically, acoustic grating 10 comprises a substrate 11, e.g., of bulk gallium arsenide, supporting two epitaxially grown layer structures, one layered structure on each side of the substrate. Each layer structure consists of an epitaxially grown layer of GaAs 12 and 22, an epitaxially grown layer of GaAlAs 13 and 23, a second epitaxially grown layer of GaAs 14 and 24, a second epitaxially grown layer of GaAlAs 16 and 26, and so on. Suitable resonant or non-resonant transducers 17 and 27 are mounted on either side of grating 10 to serve as input and output means. The layer thicknesses and resonance frequencies are the same as in the discussion of FIG.1, but in the device of FIG. 2 the presence of two ports provides the means of obtaining filtering action, the principle of diffractometry. The frequency versus attenuation curve would show frequency pass bands and frequency stop bands whose placement is strongly dependent on the number and thicknesses of the alternating components of the superlattice structures.

Figure 3:
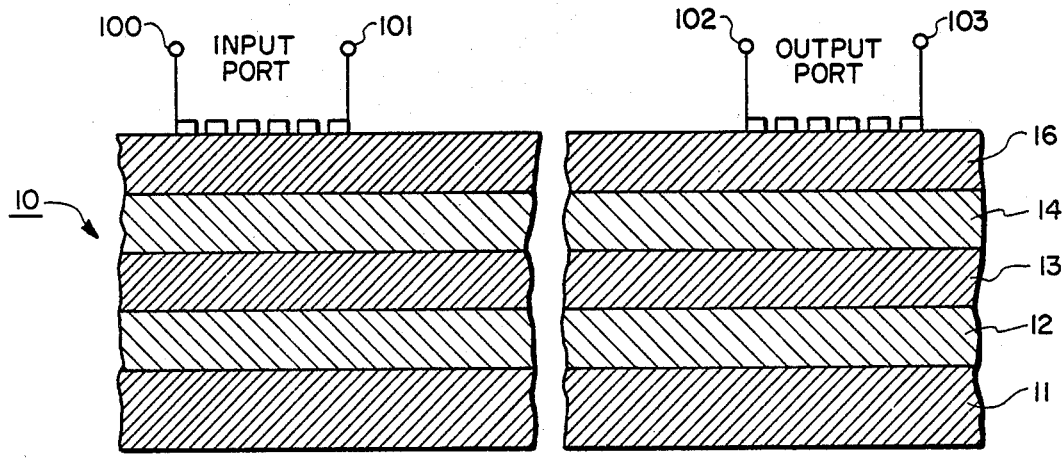
FIG. 3 is a cross-sectional view of a two-port, transverse embodiment of the invention.

FIG. 3 depicts a third illustrative embodiment of the instant invention, wherein the acoustic waves are transducted by two pairs of interdigital transducers (IDTs), one for the input and one for the output. The primary direction of propagation of the acoustic waves is transverse to the layer thicknesses of the superlattice. The presence of the piezoelectric effect in the semi-insulating epitaxial layers permits the IDT arrays to transduce between acoustic and electric signals. IDTs are currently used in surface acoustic wave (SAW) technology, and their operation, manufacture, and properties are known in the art. They may also be used to produce a variety of bulk acoustic waves known as shallow bulk acoustic waves (SBAW); Thus both SAW and SBAW operation is envisioned in the present invention. The layers of the superlattice permit both acoustic diffraction (interference) and acoustic ducting effects to produce filtering (diffractometry) action.

Figure 4:
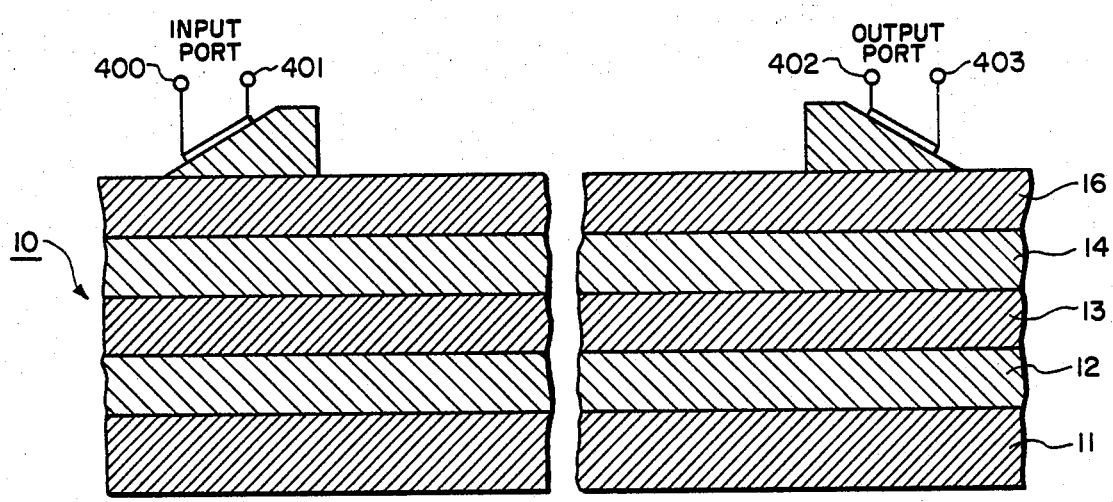
FIG. 4 is a cross-sectional view of a two-port, transverse, alternate embodiment of the invention using wedges.

FIG. 4 is similar to that of FIG. 3; this 5 embodiment is useful when the superlattice constituents are either weakly piezoelectric or nonpiezoelectric. In FIG. 4 the acoustic waves are transducted by means of bulk wave transducers located atop acoustic wedges cut at a suitable angle to permit efficient generation of acoustic waves into and out of the superlattice. The two-port nature of this device permits filtering action in similar fashion to that in FIG. 3.

Figure 5:
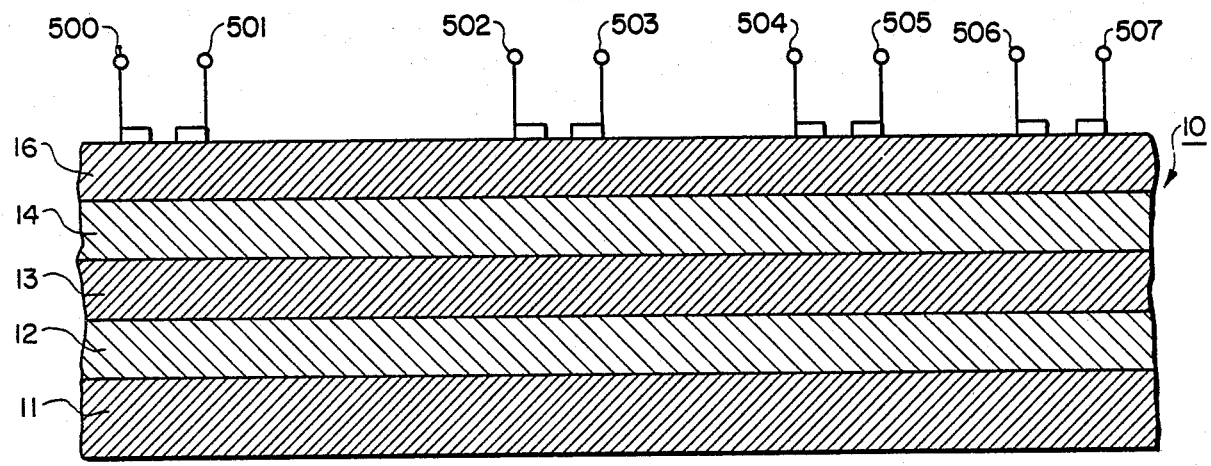
FIG. 5 is a cross-sectional view of a multi-port, transverse, alternate embodiment of the invention showing provisions for tunability or frequency adjustment.

FIG. 5 is another variation to the embodiment in FIG. 3 with a single IDT input or output and a plurality of IDT outputs (or inputs) so that by selecting one of the plurality, one may alter the response characteristics of the diffractometer device. The characteristics of the device will depend on the superlattice layer thicknesses, the acoustic properties of the layer materials, and the distance between the input and output transducers.

If the single IDT is considered as the input, the multiple IDT arrangements may be combined to produce a composite output port by connecting all of the IDT ports to an electronic device consisting, e.g., of diode switches to produce an electronically controlled and adjustable acoustic diffractometer that operates in the 100-300 GHz range. Of course, many other combinations and permutations are possible. It suffices that alternate layes in the superlattice have different acoustical and/or piezoelectric properties. Among these properties are mass density, piezoelectric constant, resistivity and other physical characteristics. One skilled in the art may make various changes and substitutions to the layout of parts shown without departing from the spirit and scope of the invention.

What is claimed is:

1. An electrical multibandpass filter device used at frequencies above 300 GHZ comprising:
    an acoustic diffractometer means which comprises a substrate of bulk gallium arsenide and at least two alternating layers of piezoelectrically active but electrically inactive GaAs material, and piezoelectrically inactive insulator with acoustic mismatch, GaAlAs material, respectively, on said substrate defining an acoustically mismatched superlattice the number and thicknesses of the alternating layers defining the frequency of the pass bands;
    electrical input means to said filter device comprising acoustic wedges, angle cut to permit efficient transmission into the superlattice including means for transducing an input electrical signal for launching the input as an acoustical wave in said acoustic diffractometer means; and
    electrical output means for said filter device comprising acoustic wedges on the opposite side of said device than the input wedges, and angle cut to permit efficient transmission out from the superlattice including means for transducing an output acoustical wave signal received from said acoustic diffractometer means into an output electrical signal.

2. The device of claim 1 wherein material on said substrate is in the cubic class43 $\overline{m}$.

3. The device of claim 1 wherein material on said substrate is from the II–VI compound semiconductor group.

4. The device of claim 1 wherein material on said substrate is from the III–V compound semiconductor group.

5. The device of claim 1 wherein the material on said substrate comprises epitaxially grown layers of semiconducting material.

6. An electrical multibandpass filter device used at frequencies above 300 GHZ comprising:
    an acoustic diffractometer means which comprises a substrate of bulk gallium arsenide and at least two alternating layers of piezoelectrically ative but electrically inactive GaAs material, and piezoelectrically inactive insulator, with acoustic mismatch, GaAlAs material respectively, on said substrate defining an acoustically mismatched superlattice, the number and thicknesses of the alternating layers defining the frequency of the pass bands;
    electrical input means to said filter device comprising interdigital transducer arrays including means for transducing an input electrical signal for launching the input as an acoustical wave in said acoustic diffractometer means, wherein the interdigital transducer arrays comprise multiple interdigital transducers, plural taps of which may selectively be used as input or output ports respectively, enabling a selectivity of response characteristics possible to the user; and
    electrical output means for said filter device comprising interdigital transducer arrays on the same side of the superlattice as the said input means including means for transducing an output acoustical wave signal received from said acoustic diffractometer means into an output electrical signal, wherein the interdigital transducer arrays comprise multiple interdigital transducers, plural taps of which may selectively be used as input or output ports respectively, enabling a selectivity of response characteristics possible to the user.

* * * * *